US012690286B2

(12) United States Patent
Hsu et al.

(10) Patent No.: US 12,690,286 B2
(45) Date of Patent: Jul. 21, 2026

(54) CHIP PACKAGING STRUCTURE

(71) Applicant: TONG HSING ELECTRONIC INDUSTRIES, LTD., Taipei City (TW)

(72) Inventors: Jui-Hung Hsu, Taipei City (TW); Li-Chun Hung, Taipei City (TW); Chien-Chen Lee, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 501 days.

(21) Appl. No.: 18/118,572

(22) Filed: Mar. 7, 2023

(65) Prior Publication Data

US 2024/0204018 A1      Jun. 20, 2024

(30) Foreign Application Priority Data

Dec. 15, 2022    (TW) .................................. 111148327

(51) Int. Cl.
| | |
|---|---|
| *H10F 39/00* | (2025.01) |
| *H10W 90/00* | (2026.01) |
| *H10W 72/50* | (2026.01) |

(52) U.S. Cl.
CPC ....... *H10F 39/8057* (2025.01); *H10F 39/804* (2025.01); *H10W 72/50* (2026.01); *H10W 90/754* (2026.01)

(58) Field of Classification Search
CPC ... H10F 39/8057; H10F 39/804; H01L 24/48; H01L 2224/48227; H10W 90/754; H10W 72/50
See application file for complete search history.

(56) References Cited

U.S. PATENT DOCUMENTS

| | | | |
|---|---|---|---|
| 12,189,152 B2 * | 1/2025 | Chang | .................. G02B 5/0278 |
| 2023/0197744 A1 * | 6/2023 | Chang | ................ H10F 39/8057 |
| | | | 257/434 |
| 2024/0204019 A1 * | 6/2024 | Lin | ..................... H10F 39/8057 |
| 2024/0395950 A1 * | 11/2024 | Hsu | ........................ H10F 77/50 |

* cited by examiner

*Primary Examiner* — David Vu
*Assistant Examiner* — Brandon C Fox
(74) *Attorney, Agent, or Firm* — Birch, Stewart, Kolasch & Birch, LLP

(57) ABSTRACT

A chip packaging structure is provided. The chip packaging structure includes a first substrate, an image sensing chip, a supporting member, a second substrate, a grating film, and an encapsulant. The image sensing chip is disposed on an upper surface of the first substrate and has an image sensing region. The supporting member is disposed on an upper surface of the image sensing chip and surrounds the image sensing region. The second substrate is disposed on an upper surface of the supporting member. The grating film is disposed on a peripheral region of the second substrate and includes a plurality of grating units. The encapsulant is attached to the upper surface of the first substrate, a side surface of the supporting member, and a side surface of the second substrate.

6 Claims, 6 Drawing Sheets

S1

909

S2          909

CHIP PACKAGING STRUCTURE

CROSS-REFERENCE TO RELATED APPLICATION

This non-provisional application claims priority under 35 U.S.C. § 119(a) to Patent Application No. 111148327 filed in Taiwan, R.O.C. on Dec. 15, 2022, the entire contents of which are hereby incorporated by reference.

BACKGROUND

Technical Field

The instant disclosure relates to a chip packaging structure.

Related Art

For a packaging structure for a CMOS image sensing chip known to the inventor, the adhesive is applied to dispose a frame component (which is so called as a dam) on an upper surface of the CMOS image sensing chip and surround the image sensing region at a center portion of the CMOS image sensing chip, and a cover glass is disposed on the dam, so that the image sensing region of the CMOS image sensing chip is sealed within a hermetic space defined by the cover glass and the dam.

To prevent the flare effect, a black mask is usually provided on the peripheral region of the cover glass, and only the center portion of the cover glass right above the image sensing region is light transmissible. Therefore, unexpected lights can be prevented from entering the image sensing region through the peripheral region of the cover glass. However, the cover glass is attached to the top surface of the dam through polymer adhesive (e.g., epoxy resin), and the location of the polymer adhesive is below the peripheral region which is coated with the black mask. As a result, the polymer adhesive can only adopt the thermosetting polymer adhesive. Moreover, whether the curing of the polymer adhesive is completed during the curing process and whether the cured polymer adhesive has defects cannot be determined through optical inspection instruments and can only be determined empirically.

SUMMARY

In view of this, in one embodiment, a chip packaging structure is provided. The chip packaging structure comprises a first substrate, an image sensing chip, a supporting member, a second substrate, a grating film, and an encapsulant. The image sensing chip is disposed on an upper surface of the first substrate, and the image sensing chip has an image sensing region. The supporting member is disposed on an upper surface of the image sensing chip and surrounds the image sensing region. The second substrate is disposed on an upper surface of the supporting member. The second substrate has a central region and a peripheral region surrounding the central region, the central region corresponds to the image sensing region, and the peripheral region is supported by the supporting member. The grating film is disposed on the peripheral region of the second substrate, and the grating film comprises a plurality of grating units. The encapsulant is attached to the upper surface of the first substrate, a side surface of the supporting member, and a side surface of the second substrate.

According to one some embodiments of the instant disclosure, because the light is allowed to pass through the grating film within a viewing angle of the grating film, light curing polymer adhesives can be chosen as the encapsulant of the chip packaging structure. Moreover, according to one or some embodiments of the instant disclosure, the optical inspection instrument can be disposed within the viewing angle of the grating film to monitor whether the curing is completed or whether the gluing surface between components has defects in a real-time manner.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1A:
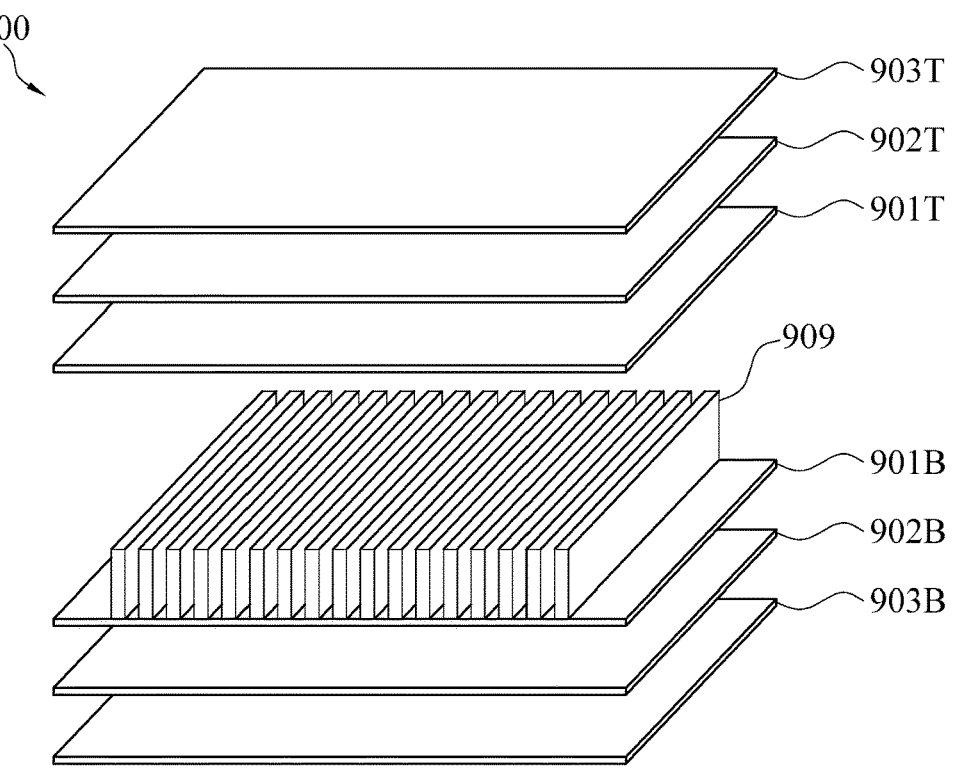
FIG. 1A illustrates a schematic exploded view of an exemplary grating film adapted to be utilized the instant disclosure.
Figure 1B:
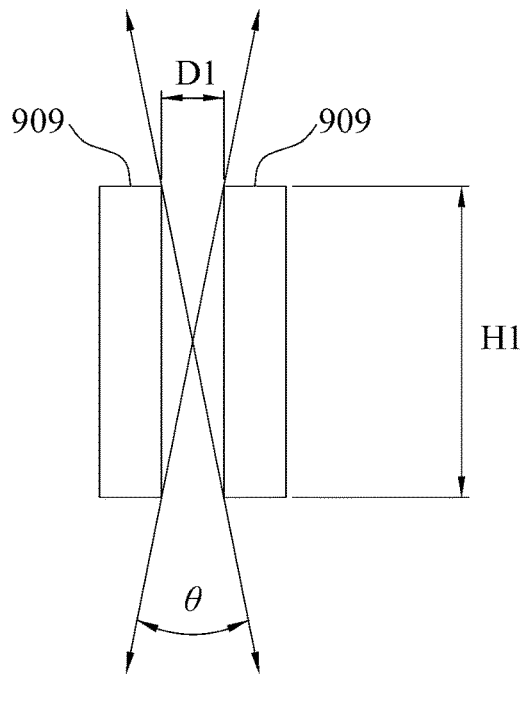
FIG. 1B illustrates a schematic view showing the viewing angle of an exemplary grating film adapted to be utilized the instant disclosure.

FIG. 1A and FIG. 1B illustrate a schematic exploded view and a schematic view of an exemplary grating film 900 adapted to be utilized the instant disclosure. The grating film 900 comprises a top PET layer 901T, a bottom PET layer 901B, a top hardening layer 902T, a bottom hardening layer 902B, a top protection layer 903T, a bottom protection layer 903B, and a plurality of grating units 909 formed between the top PET layer 901T and the bottom PET layer 901B. From a microscopic view, the grating films B are elongated shaped and extending along a certain dimension. As shown in FIG. 1B, without considering the diffraction phenomenon, the distance D1 between the grating units 909 and the height H1 of the grating unit 909 define an angle θ with which the light can pass through the grating film 900. The angle θ is the viewing angle θ of the grating film 900, and the light out of the viewing angle θ is blocked by the grating units 909 and cannot pass through the grating film 900 directly.

Figure 2:
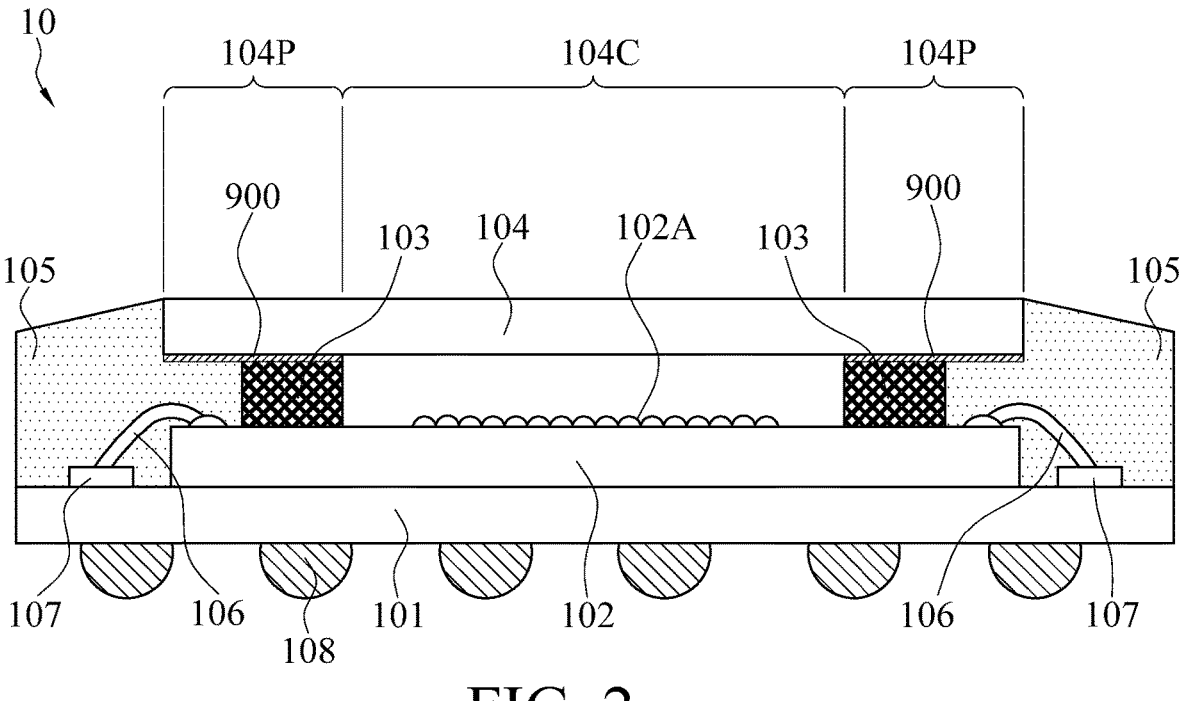
FIG. 2 illustrates a schematic view of a chip packaging structure according to a first embodiment of the instant disclosure.

FIG. 2 illustrates a schematic view of a chip packaging structure according to a first embodiment of the instant disclosure, in which a chip packaging structure 10 is illustrated. The chip packaging structure 10 comprises a first substrate 10, an image sensing chip 102, a supporting member 103, a second substrate 104, a grating film 900, and an encapsulant 105. The image sensing chip 102 is disposed on an upper surface of the first substrate 101 and has an image sensing region 102A. The supporting member 103 is disposed on an upper surface of the image sensing chip 102 and surrounds the image sensing region 102A. The second substrate 104 is disposed on an upper surface of the supporting member 103, and the second substrate 104 has a central region 104C and a peripheral region 104P surrounding the central region 104C. The central region 104C of the second substrate 104 corresponds to the image sensing region 102A of the first substrate 101. The peripheral region 104P is supported by the supporting member 103, and the peripheral region 104P is not coated with the black mask and is light transmissible. The grating film is 900 disposed on a lower surface of the peripheral region 104P of the second substrate 104. The grating film 900 comprises a plurality of grating units 909. The encapsulant 105 is attached to the upper surface of the first substrate 101, a side surface of the supporting member 103, and a side surface of the second substrate 104.

According to one or some embodiments of the instant disclosure, as compared to the packaging structure for an image sensing chip known to the inventor, the peripheral region 104P of the chip packaging structure 10 is not coated with the black mask; instead, the grating film 900 is disposed on the peripheral region 104P of the chip packaging structure 10. Therefore, after the second substrate 104 is attached to the supporting member 103 through the polymer adhesive, the lens of the optical inspection instrument can be disposed within the field of view of the grating film 900 to monitor whether the curing is completed or whether the gluing surface between components has defects. Moreover, during the curing process, the optical inspection instrument can be disposed within the viewing angle of the grating film 900 to monitor the curing of the polymer adhesive in a real-time manner. Therefore, according to one or some embodiments of the instant disclosure, the failure mode caused by the poor gluing between the second substrate 104 and the supporting member 103 can be greatly reduced.

In some embodiments, a transmittance of the grating units 909 for a visible light wavelength (in a range between 380 nm and 750 nm) is in a range between 0% and 10%. In some other embodiments, the transmittance of the grating units 909 for the visible light wavelength is in a range between 0% and 1%.

In some embodiments, before the second substrate 104 is disposed on the supporting member 103, the grating film 900 is formed on the lower surface of the peripheral region 104P of the second substrate 104. Then, the polymer adhesive is coated on the upper surface of the supporting member 103, and the second substrate 104 is attached to the supporting member 103 with the grating film 900 facing the polymer adhesive on the supporting member 103.

In some embodiments, before the second substrate 104 is disposed on the supporting member 103, the polymer adhesive is coated on the upper surface of the supporting member 103. Then, the polymer adhesive is coated on the upper surface of the grating film 900, and the second substrate 104 is attached to the grating film 900 with the peripheral region 104P of the second substrate 104 aiming at the polymer adhesive on the grating film 900.

In some embodiments, the image sensing chip 102 is electrically connected to the contact 107 on the upper surface of the first substrate 101 through a conductive wire 106 by wire bonding, so that signals of the image sensing chip 102 can be transmitted to external circuits through a solder ball 108 on the lower surface of the first substrate 101.

Figure 3:
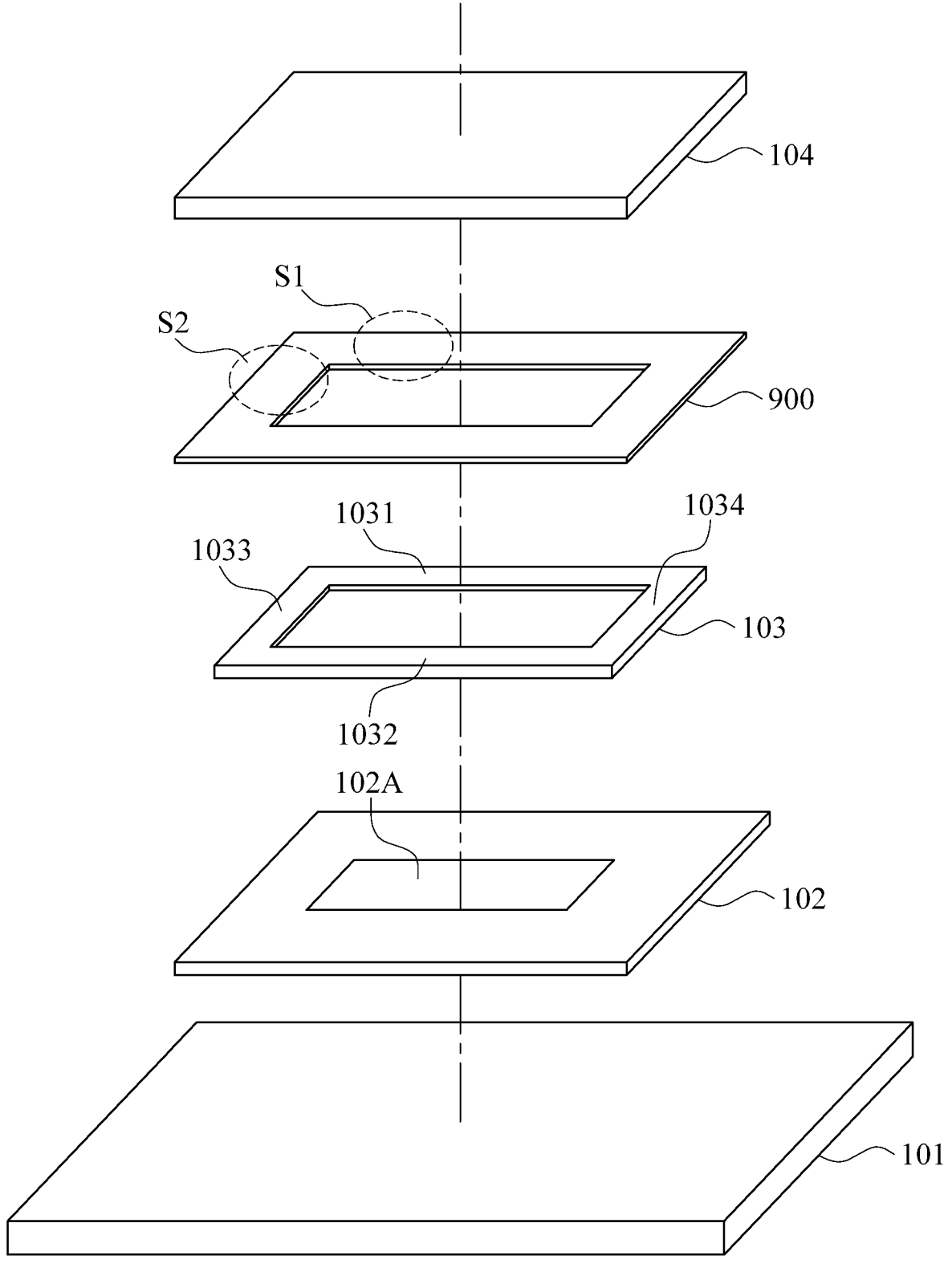
FIG. 3 illustrates a schematic exploded view of the chip packaging structure according to the first embodiment of the instant disclosure.

FIG. 3 illustrates a schematic exploded view of the chip packaging structure according to the first embodiment of the instant disclosure. As shown, in some embodiments, the supporting member 103 is rectangular shaped and comprises a first longer section 1031, a second longer section 1032, a first shorter section 1033, and a second shorter section 1034. The first longer section 1031 is parallel to the second longer section 1032, and the first shorter section 1033 is parallel to the second shorter section 1034. Two ends of the first longer section 1031 are respectively connected to one of two ends of the first shorter section 1033 and one of two ends of the second shorter section 1034, and two ends of the second longer section 1032 are respectively connected to the other end of the first shorter section 1033 and the other end of the second shorter section 1034.

Figure 4A:
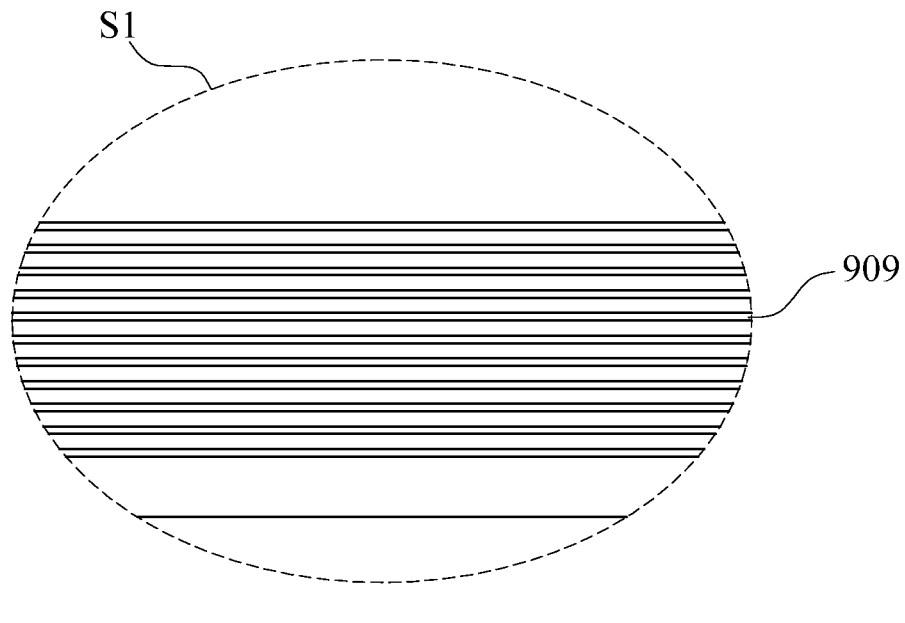
FIG. 4A illustrates an enlarged view (1) of the region S1 of the grating film shown in FIG. 3.

FIG. 4A illustrates an enlarged view (1) of the region S1 of the grating film shown in FIG. 3. As shown, in some embodiments, the grating units 909 of the grating film 900 above the first longer section 1031 are parallel to the first longer section 1031. Likewise, the grating units 909 of the grating film 900 above the second longer section 1032 are also parallel to the second longer section 1032.

Figure 4B:
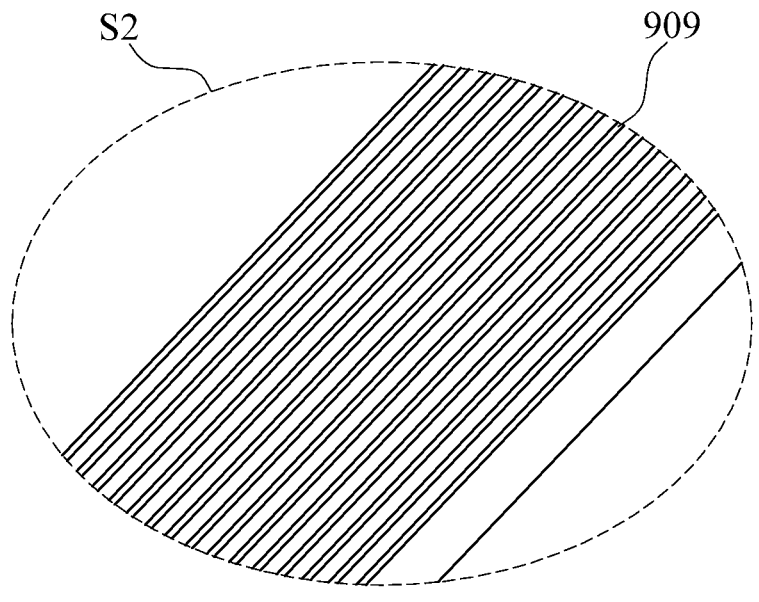
FIG. 4B illustrates an enlarged view (1) of the region S2 of the grating film shown in FIG. 3.

FIG. 4B illustrates an enlarged view (1) of the region S2 of the grating film shown in FIG. 3. As shown, in some embodiments, the grating units 909 of the grating film 900 above the first shorter section 1033 are parallel to the first shorter section 1033. Likewise, the grating units 909 of the grating film 900 above the second shorter section 1034 are also parallel to the second shorter section 1034.

Figure 5A:
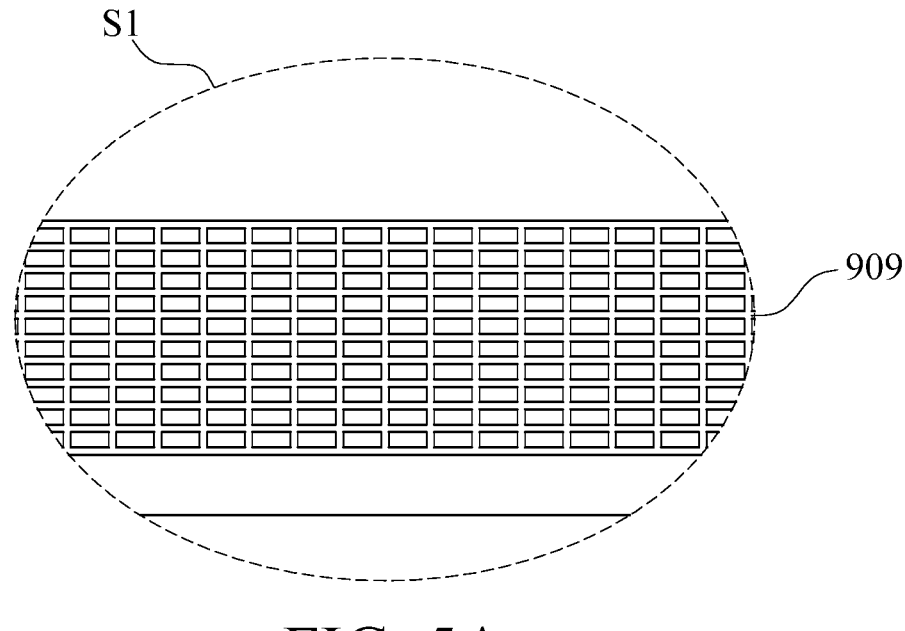
FIG. 5A illustrates an enlarged view (2) of the region S1 of the grating film shown in FIG. 3.

FIG. 5A illustrates an enlarged view (2) of the region S1 of the grating film shown in FIG. 3. As shown, in some embodiments, the grating units 909 of the grating film 900 above the first longer section 1031 are intersected with each other to form a mesh configuration. Likewise, the grating units 909 of the grating film 900 above the second longer section 1032 are intersected with each other to form a mesh configuration.

Figure 5B:
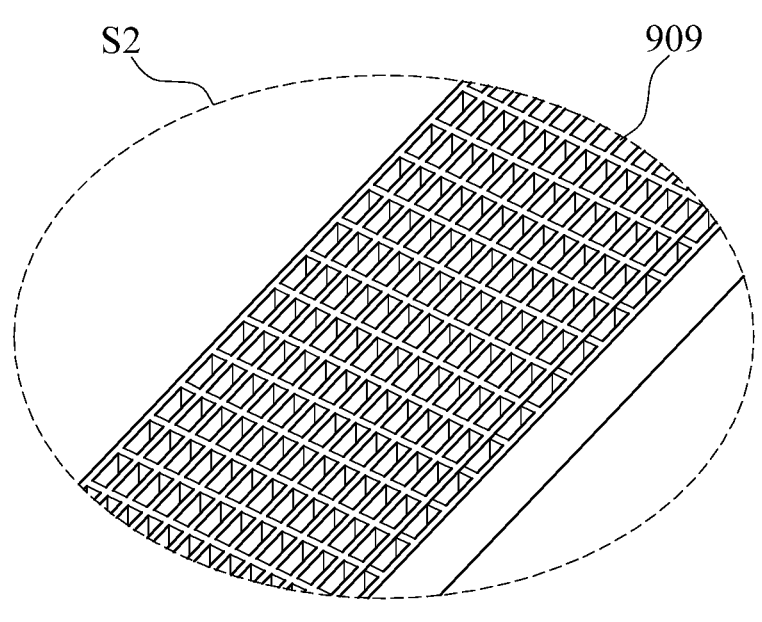
FIG. 5B illustrates an enlarged view (2) of the region S2 of the grating film shown in FIG. 3.

FIG. 5B illustrates an enlarged view (2) of the region S2 of the grating film shown in FIG. 3. As shown, in some embodiments, the grating units 909 of the grating film 900 above the first shorter section 1033 are intersected with each other to form a mesh configuration. Likewise, the grating units 909 of the grating film 900 above the second shorter section 1034 are intersected with each other to form a mesh configuration.

In some embodiments, the grating units 909 of the grating film 900 above the first longer section 1031 and the second longer section 1032 are intersected with each other to form a mesh configuration, the grating units 909 of the grating film 900 above the first shorter section 1033 are parallel to the first shorter section 1033, and the grating units 909 of the grating film 900 above the second shorter section 1034 are parallel to the second shorter section 1034.

In some embodiments, the grating units 909 of the grating film 900 above the first longer section 1031 are parallel to the first longer section 1031, the grating units 909 of the grating film 900 above the second longer section 1032 are parallel to the second longer section 1032, and the grating units 909 of the grating film 900 above the first shorter section 1033 and the second shorter section 1034 are intersected with each other to form a mesh configuration.

In some embodiments, the transmittance of the grating units 909 for the visible light wavelength is in a range between 0% and 10%. Preferably, in one embodiment, the transmittance of the grating units 909 for the visible light wavelength is in a range between 0% and 1%.

In some embodiments, the distance D1 between the grating units 909 of the grating film 900 is substantially 20 micrometers, the height H1 of the grating unit 909 is substantially 229 micrometers, and the viewing angle θ is substantially 10 degrees. In some embodiments, the distance D1 between the grating units 909 of the grating film 900 is substantially 20 micrometers, the height H1 of the grating unit 909 is substantially 75 micrometers, and the viewing angle θ is substantially 30 degrees. In some embodiments, the distance D1 between the grating units 909 of the grating film 900 is substantially 20 micrometers, the height H1 of the grating unit 909 is substantially 35 micrometers, and the viewing angle θ is substantially 60 degrees. In some embodiments, the distance D1 between the grating units 909 of the grating film 900 is substantially 60 micrometers, the height H1 of the grating unit 909 is substantially 686 micrometers, and the viewing angle θ is substantially 10 degrees. In some embodiments, the distance D1 between the grating units 909 of the grating film 900 is substantially 60 micrometers, the height H1 of the grating unit 909 is substantially 224 micrometers, and the viewing angle θ is substantially 30 degrees. In some embodiments, the distance D1 between the grating units 909 of the grating film 900 is substantially 60 micrometers, the height H1 of the grating unit 909 is substantially 104 micrometers, and the viewing angle θ is substantially 60 degrees. In some embodiments, the distance D1 between the grating units 909 of the grating film 900 is substantially 100 micrometers, the height H1 of the grating unit 909 is substantially 1143 micrometers, and the viewing angle θ is substantially 10 degrees. In some embodiments, the distance D1 between the grating units 909 of the grating film 900 is substantially 100 micrometers, the height H1 of the grating unit 909 is substantially 373 micrometers, and the viewing angle θ is substantially 30 degrees. In some embodiments, the distance D1 between the grating units 909 of the grating film 900 is substantially 100 micrometers, the height H1 of the grating unit 909 is substantially 173 micrometers, and the viewing angle θ is substantially 60 degrees.

In this embodiment, through utilizing the property of the grating film 900 properly, in the chip packaging structure 10, the second substrate 104 is attached to the supporting member 103 through a light curing polymer adhesive. Moreover, whether the curing of the polymer adhesive is completed or whether the gluing surface between components has defects can be monitored in a real-time manner. Therefore, according to one or some embodiments of the instant disclosure, the failure mode caused by the poor gluing between the second substrate 104 and the supporting member 103 can be greatly reduced.

In some embodiments, the first substrate 101 may be made of resin (or a mixture of resin and glass fibers), ceramic, or glass. For example, the first substrate 101 is made of silicon nitride ($Si_3N_4$), aluminum oxide ($Al_2O_3$), aluminum nitride (AlN), zirconium dioxide ($ZrO_2$), zirconium toughed alumina (ZTA), beryllium oxide (BeO), or other ceramics. Therefore, the first substrate 101 has the advantages of higher structural strength, higher thermal conductivity, lower warpage, lower thermal expansion coefficient (for example, aluminum oxide with a thermal expansion coefficient of $8\times10^{-6}/°$ C. or aluminum nitride with a thermal expansion coefficient of $5.0\times10^{-6}/°$ C. may be adopted), and good electrical insulation. In some embodiments, the first substrate 101 is a double-sided circuit substrate, and traces are provided on the upper surface and a lower surface of the first substrate 101 for being electrically connected to the electronic components on the upper surface and/or the lower surface of the first substrate 101, respectively.

In some embodiments, the image sensing chip 102 may be an image sensing chip 102 for visible light or invisible light. To facilitate light transmission, in some embodiments, the second substrate 104 is made of a light transmissible material, and the light transmissible material may be one or a mixture of the material(s) selected from the group consisting of glass, poly(methyl methacrylate) (PMMA), polystyrene (PS), polycarbonate (PC), diallyl glycol carbonates CR-39, acrylonitrile-styrene copolymer (SAN), poly(4-methyl-1-pentene) (TPX) and transparent polyamide (PA).

In some embodiments, the encapsulant 105 may be epoxy, polyimide (PI), or silicone. The encapsulant 105 is provided to prevent moisture from entering the interior of the chip packaging structure 10. Alternatively, in some embodiments, the encapsulant 105 is provided to form an opaque layer to block the ambient light from entering the package so as to prevent the stray lights.

In some embodiments, the material of the supporting member 103 may be one or a mixture of the material(s) selected from the group consisting of polyurethane (PU), polyacrylonitrile (PAN), polyvinyl alcohol (PVA), polylactide (PLA), polyethylene oxide (PEO), polyethylene terephthalate (PET), polyvinyl pyrrolidone (PVP), polyvinyl chloride (PVC), cellulose acetate (CA), poly(lactic-co-glycolic acid) (PLGA), polycaprolactone (PCL), polyethylene glycol (PEG), polydimethylsiloxane (PDMS), glass fiber, PS, PMMA, PA, and PA 6.6.

Figure 6:
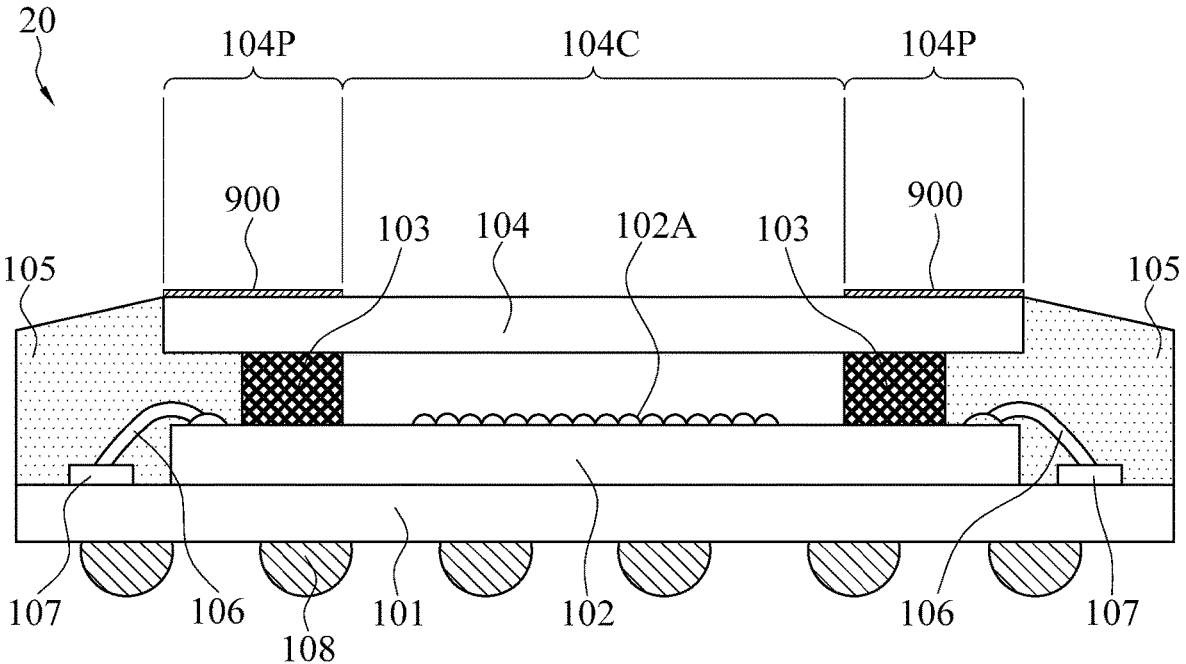
FIG. 6 illustrates a schematic view of a chip packaging structure according to a second embodiment of the instant disclosure.

FIG. 6 illustrates a schematic view of a chip packaging structure according to a second embodiment of the instant disclosure, in which a chip packaging structure 20 is illustrated. The chip packaging structure 20 comprises a first substrate 10, an image sensing chip 102, a supporting member 103, a second substrate 104, a grating film 900, and an encapsulant 105. The image sensing chip 102 is disposed on an upper surface of the first substrate 101 and has an image sensing region 102A. The supporting member 103 is disposed on an upper surface of the image sensing chip 102 and surrounds the image sensing region 102A. The second substrate 104 is disposed on an upper surface of the supporting member 103, and the second substrate 104 has a central region 104C and a peripheral region 104P surrounding the central region 104C. The central region 104C of the second substrate 104 corresponds to the image sensing region 102A of the first substrate 101. The peripheral region 104P is supported by the supporting member 103, and the peripheral region 104P is not coated with the black mask and is light transmissible. The grating film is 900 disposed on an upper surface of the peripheral region 104P of the second substrate 104. The grating film 900 comprises a plurality of grating units 909. The encapsulant 105 is attached to the upper surface of the first substrate 101, a side surface of the supporting member 103, and a side surface of the second substrate 104.

As compared with the chip packaging structure 10, the grating film 900 of the chip packaging structure 20 is formed on the upper surface of the peripheral region 104P of the second substrate 104 rather than between the peripheral region 104P of the second substrate 104 and the upper surface of the supporting member 103. In other words, in this embodiment, the grating film 900 can be formed on the upper surface of the peripheral region 104P of the second substrate 104 after the chip cutting step is finished. Therefore, under this configuration, the grating film 900 can be prevented from suffering thermal damages during the manufacturing process of the chip packaging structure 20.

Moreover, in this embodiment, the composition of the polymer adhesive (the encapsulant 105) for attaching the second substrate 104 on the supporting member 103 is designed according to the surfaces on which the polymer adhesive is to be attached (the upper surface of the supporting member 103 and the surface of the peripheral region 104P of the second substrate 104). Therefore, another advantage of the chip packaging structure 20 as compared with the chip packaging structure 10 is that, the hermeticity of the chip packaging structure 20 does not need to be verified again due to the existence of the grating film 900.

In this embodiment, the peripheral region 104P of the second substrate 104 is not coated with the black mask. Therefore, after the second substrate 104 is attached to the supporting member 103 through the polymer adhesive, whether the curing of the polymer adhesive is completed or whether the gluing surface between components has defects can be monitored through the optical inspection instrument in a real-time manner. Likewise, during the curing process, whether the curing is completed or whether the gluing surface between components has defects can be monitored in a real-time manner. Therefore, according to one or some embodiments of the instant disclosure, the failure mode caused by the poor gluing between the second substrate 104 and the supporting member 103 can be greatly reduced, thereby effectively increasing the yield rate of the chip packaging structure 20.

The terms "top/upper" or "bottom/lower" in the contents of the description is only for the purpose of illustrating the technical contents of the disclosed embodiments or the relative relationships of the components, and is not intended to limit the absolute spatial position of the components. For example, the description of "the second substrate is disposed on the supporting member" not only can be interpreted as the second substrates is approaching the supporting member in a top-to-bottom direction, and the peripheral region of the second substrate is attached to the supporting member, such description can be interpreted as the supporting member is approaching the second substrate in a top-to-bottom direction and attached to the peripheral region of the second substrate. In other words, the embodiments illustrated in the description and drawings are provided to allow a person having ordinary skills in the art can realize the invention and are not provided to limit the claim scopes of the invention.

What is claimed is:

1. A chip packaging structure comprising:
a first substrate;
an image sensing chip disposed on an upper surface of the first substrate, wherein the image sensing chip has an image sensing region;
a supporting member disposed on an upper surface of the image sensing chip and surrounding the image sensing region;
a grating film disposed on the peripheral region of the second substrate, wherein the grating film comprises a plurality of grating units, and a height of each of the grating units is greater than a distance between two of the grating units adjacent to each other; and
an encapsulant attached to the upper surface of the first substrate, a side surface of the supporting member, and a side surface of the second substrate.

2. The chip packaging structure according to claim 1, wherein a transmittance of the grating units for a visible light wavelength is in a range between 0% and 10%.

3. The chip packaging structure according to claim 2, wherein the transmittance of the grating units for the visible light wavelength is in a range between 0% and 1%.

4. The chip packaging structure according to claim 1, wherein the grating film is disposed on a lower surface of the peripheral region of the second substrate.

5. A chip packaging structure comprising,
a first substrate;
an image sensing chip disposed on an upper surface of the first substrate, wherein the image sensing chip has an image sensing region;
a supporting member disposed on an upper surface of the image sensing chip and surrounding the image sensing region;
a second substrate disposed on an upper surface of the supporting member, wherein the second substrate has a central region and a peripheral region surrounding the central region, the central region corresponds to the image sensing region, and the peripheral region is supported by the supporting member;
a grating film disposed on the peripheral region of the second substrate, wherein the grating film comprises a plurality of grating units; and
an encapsulant attached to the upper surface of the first substrate, a side surface of the supporting member, and a side surface of the second substrate;
wherein the grating film is disposed on an upper surface of the peripheral region of the second substrate.

6. The chip packaging structure according to claim 5, wherein the grating film further comprises a plurality of perpendicular grating units, the perpendicular grating units above the first longer section are perpendicular to the first longer section and intersected with all the ring-shaped grating units to form a mesh configuration; the perpendicular grating units above the second longer section are perpendicular to the second longer section and intersected with all the ring-shaped grating units to form a mesh configuration; the perpendicular grating units above the first shorter section are perpendicular to the first shorter section and intersected with all the ring-shaped grating units to form a mesh configuration; and the perpendicular grating units above the second shorter section are perpendicular to the second shorter section and intersected with all the ring-shaped grating units to form a mesh configuration.

* * * * *